United States Patent
Kawasumi

(10) Patent No.: US 8,144,532 B2
(45) Date of Patent: Mar. 27, 2012

(54) SEMICONDUCTOR MEMORY DEVICE AND METHOD OF CONTROLLING SAME

(75) Inventor: Atsushi Kawasumi, Kawasaki (JP)

(73) Assignee: Kabushiki Kaisha Toshiba (JP)

( * ) Notice: Subject to any disclaimer, the term of this patent is extended or adjusted under 35 U.S.C. 154(b) by 187 days.

(21) Appl. No.: 12/728,167

(22) Filed: Mar. 19, 2010

(65) Prior Publication Data
US 2011/0013468 A1    Jan. 20, 2011

(30) Foreign Application Priority Data
Jul. 16, 2009  (JP) ................................ 2009-167888

(51) Int. Cl.
*G11C 7/00*  (2006.01)
(52) U.S. Cl. ....................................... 365/194; 365/207
(58) Field of Classification Search .................. 365/194, 365/207, 205
See application file for complete search history.

(56) References Cited

U.S. PATENT DOCUMENTS

| 6,490,214 B2 | 12/2002 | Kawasumi |
| 6,806,753 B2 | 10/2004 | Kawasumi |
| 7,813,200 B2 * | 10/2010 | Seo ................................ 365/205 |
| 2005/0117413 A1 * | 6/2005 | Kang ............................ 365/194 |
| 2010/0039851 A1 * | 2/2010 | Morita et al. .................. 365/145 |

FOREIGN PATENT DOCUMENTS

JP    H09-259589 A    10/1997

OTHER PUBLICATIONS

Backround Art Information Sheet.

* cited by examiner

*Primary Examiner* — Anh Phung
(74) *Attorney, Agent, or Firm* — Knobbe, Martens, Olson & Bear LLP

(57) ABSTRACT

A memory cell is provided at an intersection of a word line and a bit line. A sense amplifier circuit senses and amplifies a signal on the bit line. Replica circuits include a replica cell configured to retain certain data fixedly. A signal detection circuit detects an output signal that rises up at the latest timing among output signals output from the plurality of replica circuits respectively and outputs a detection signal. A delay circuit delays the detection signal. The sense amplifier circuit is activated based on the delayed signal.

16 Claims, 4 Drawing Sheets

SEMICONDUCTOR MEMORY DEVICE AND METHOD OF CONTROLLING SAME

CROSS REFERENCE TO RELATED APPLICATIONS

This application is based on and claims the benefit of priority from prior Japanese Patent Application No. 2009-167888, filed on Jul. 16, 2009, the entire contents of which are incorporated herein by reference.

BACKGROUND OF THE INVENTION

1. Field of the Invention

The present invention relates to a semiconductor memory device and a method of controlling the same, and particularly to a semiconductor memory device including so-called replica cells and a method of controlling the same.

2. Description of the Related Art

General semiconductor memory devices execute reading of data by means of a sense amplifier circuit, which senses at a certain timing a signal level that appears on a bit line in accordance with the data retained in a memory cell, and amplifies the signal level. Accordingly, in order to accelerate the operation speed of a semiconductor memory device, it is desirable to shorten the time taken from selection of a memory cell to activation of the sense amplifier.

However, if the sense amplifier circuit is activated too early, the sensing/amplifying operation of the sense amplifier circuit is started before a sufficient signal level appears on a bit line, which increases the possibility of erroneous reading. Hence, it is necessary to set an optimum timing at which no erroneous reading occurs and at which it is possible to accelerate the operation speed.

Here, as a technique for generating (rising up) an activation signal for the sense amplifier at an appropriate timing, a semiconductor memory device is known which utilizes a replica circuit (see, e.g., JPH9-259589A). The replica circuit includes replica cells configured in a structure that is the same as or similar to a memory cell array. The replica circuit generates (simulates), based on the replica cells, a timing signal for reading of data from the memory cells, and activates the sense amplifier based on this timing signal. The replica circuit is configured as an arrangement of a plurality of replica cells having a structure that is the same as or similar to the memory cells.

Incidentally, along with increasing miniaturization of the memory cells, supply voltage of semiconductor memory devices has become lower. Due to this, there has been found a more noticeable dispersion in the amount of delay of output signals output by the respective memory cells. However, existing replica circuits are not designed in consideration of such dispersion, and suffer from a problem of high possibility of erroneous reading due to the dispersion.

SUMMARY OF THE INVENTION

A semiconductor memory device according to one aspect of the present invention includes: a memory cell array configured as an arrangement of memory cells each provided at an intersection of a word line and a bit line; a sense amplifier circuit configured to sense and amplify a signal on the bit line; a plurality of replica circuits including a replica cell configured to retain certain data fixedly; a signal detection circuit configured to detect an output signal that rises up at the latest timing among output signals output from the plurality of replica circuits respectively thereby outputting a detection signal; and a delay circuit configured to delay the detection signal, the sense amplifier circuit being activated based on the delayed signal.

A method of controlling a semiconductor memory device according to one aspect of the present invention is a method of controlling a semiconductor memory device, the device including: a memory cell array configured as an arrangement of memory cells each provided at an intersection between a word line and a bit line; a sense amplifier circuit configured to sense and amplify a signal on the bit line; and a plurality of replica circuits including a replica cell configured to retain certain data fixedly. The method includes: detecting an output signal that rises up at the latest timing among output signals output from the plurality of replica circuits respectively and outputting a detection signal; delaying the detection signal; and activating the sense amplifier circuit based on the delayed signal.

DETAILED DESCRIPTION OF THE EMBODIMENTS

Next, an embodiment of the invention will be explained in detail with reference to the drawings. In the following embodiment, as an example, a case will be explained where the present invention is applied to a static random access memory (SRAM). However, the present invention is not limited to this, but, needless to say, can be applied to any other semiconductor memory devices that can utilize a replica circuit configured as an arrangement of replica cells.

Figure 1:
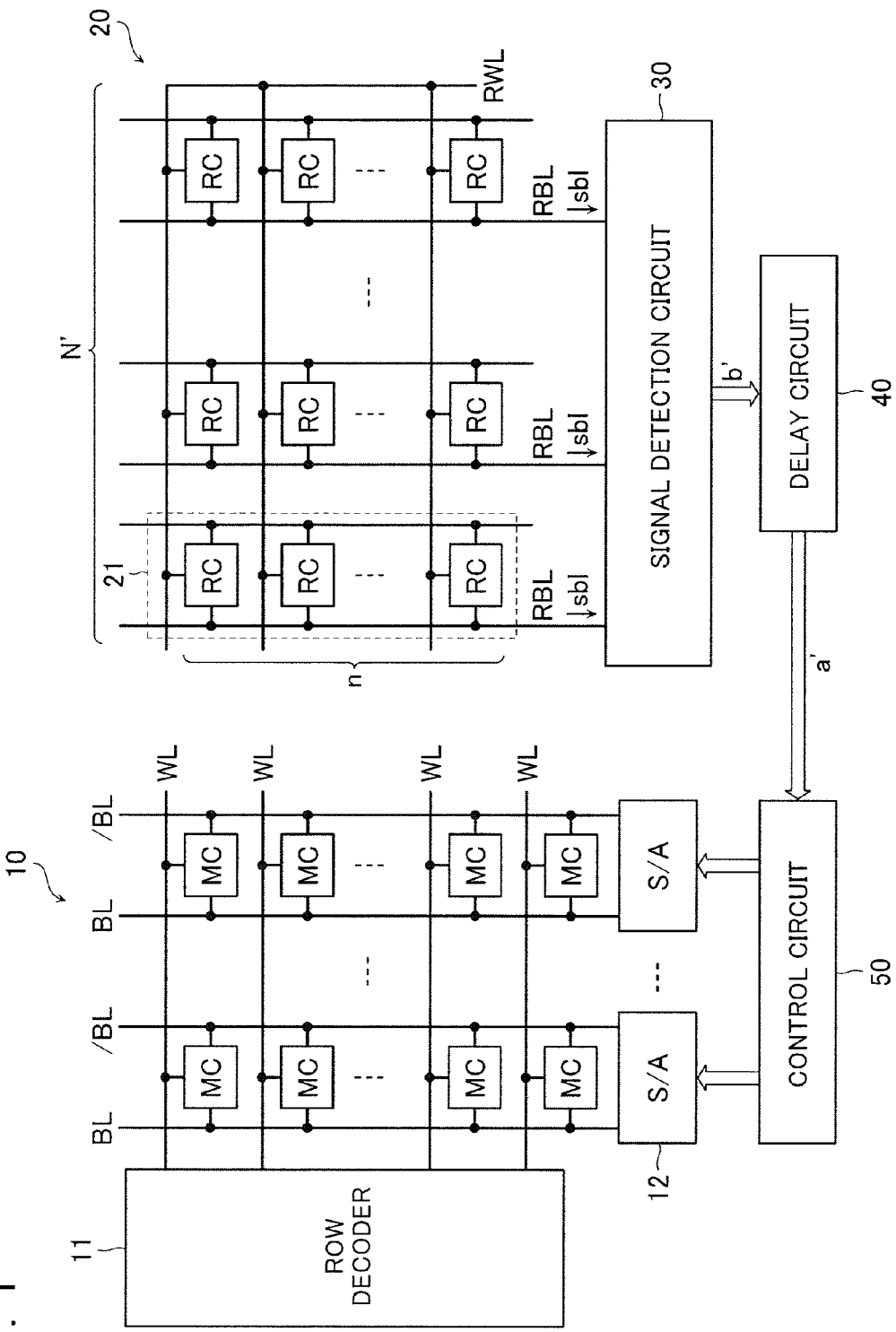
FIG. 1 is a circuit diagram showing a whole configuration of a semiconductor memory device according to an embodiment of the present invention.

First, the whole configuration of the semiconductor memory device according to the embodiment of the present invention will be explained with reference to FIG. 1. As shown in FIG. 1, the semiconductor memory device according to the present embodiment is roughly composed of a memory cell array 10, a replica cell array 20, a signal detection circuit 30, a delay circuit 40, and a control circuit 50.

The memory cell array 10 is configured as a matrix arrangement of a plurality of memory cells MC, which are each disposed at an intersection of a pair of bit lines BL,/BL, and a word line WL. The memory cell MC is composed of a pair of inverter circuits in inverse-parallel connection, though not illustrated. A row decoder 11 is provided as a component that supplies an activation signal selectively to the word lines WL to select the memory cells. A sense amplifier circuit S/A is provided for sensing and amplifying a signal read out onto the pair of bit lines BL, /BL from a selected memory cell MC.

The replica cell array 20 is configured as a matrix arrangement of a plurality of replica cells RC, which are each disposed at an intersection of a replica bit line RBL and a replica word line RWL. One replica bit line RBL has n replica cells RC connected thereto, which constitute one replica circuit 21. Thus, the replica cell array 20 includes a plurality of replica circuits 21.

The signal detection circuit 30 detects an output signal Sblm that rises up at the latest timing among the output signals Sbl which the plurality of replica circuits 21 output to the replica bit lines RBL respectively, and outputs an output signal b' that corresponds to the rise-up timing of the detected signal Sblm. The delay circuit 40 outputs a delay signal a' that is further delayed from the output signal b'. The delay signal a' is fed to the control circuit 50. The control circuit 50 activates the sense amplifier circuit S/A in accordance with the delay signal a'. The amount of delay which the delay circuit 40 imparts to delay signal a' is determined by the ratio between the number N of the memory cells MC included in the memory cell array 10 and the number N' of the replica circuits 21 included in the replica cell array 20.

With the above-described configuration, particularly the signal detection circuit 30 and the delay circuit 40, the semiconductor memory device according to the present embodiment can activate the sense amplifier circuit at an appropriate timing even when there occurs, due to lowering of the supply voltage, a large dispersion in the amount of delay among the output signals output by the memory cells MC. Consequently, the device can suppress erroneous reading while at the same time avoiding slowdown of the operation speed.

Figure 2:
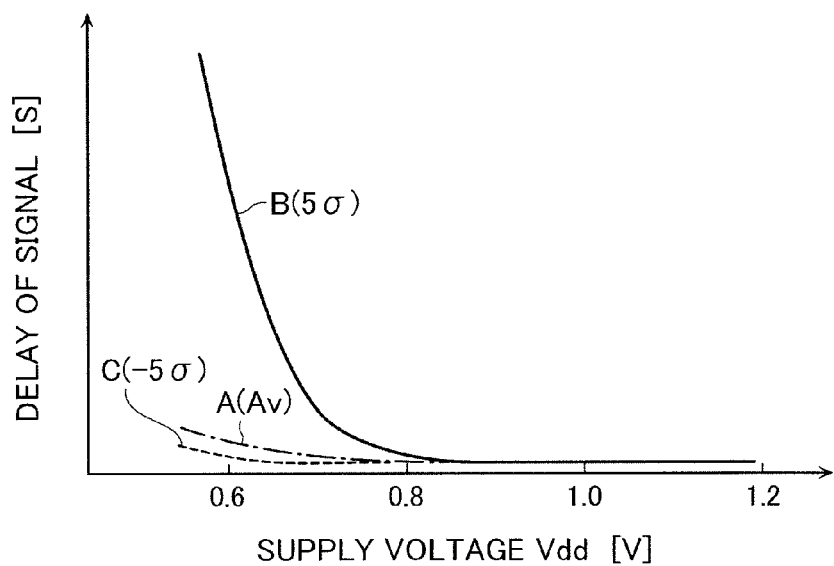
FIG. 2 is a graph showing relationship between a supply voltage and dispersion in the amount of delay of output signals from memory cells.

FIG. 2 is a graph showing relationship between a supply voltage Vdd fed to the semiconductor memory device and the amount of delay of output signals of the memory cells MC. In FIG. 2, a dashed-dotted line A (Av) represents relationship between the average of the amounts of delay of the output signals of the memory cells MC and a supply voltage Vdd. A solid line B (5σ) represents relationship between the amount of delay of an output signal having an amount of delay larger than the average Av by 5σ(σ: standard deviation) (a signal having an amount of delay by far larger than the average) and a supply voltage Vdd. A dotted line C (−5σ) represents relationship between the amount of delay of an output signal having an amount of delay smaller than the average Av by 5σ(a signal having an amount of delay by far smaller than the average) and a supply voltage Vdd.

As shown in FIG. 2, when the supply voltage is 1V or higher, there occurs substantially no dispersion in the amount of delay. However, as the supply voltage lowers to, for example, 0.8V or lower, the dispersion gradually increases. However, conventional replica circuits are not configured to be able to output an activation signal for the sense amplifier circuit at a timing that is set in consideration of such dispersion (that is to say with reference to FIG. 2, the conventional circuits control the sense amplifier circuit by focusing only on the characteristic of the curve A). Therefore, when there occurs a large dispersion and data is read out from a memory cell that outputs a signal with a large amount of delay, the sense amplifier circuit is undesirably activated before a sufficient signal appears, which might increase the possibility of erroneous reading.

Hence, according to the present embodiment, the signal detection circuit 30 detects an output signal Sblm that rises up at the latest timing among the output signals Sbl from the plurality of replica circuits 21, and outputs an output signal b' that corresponds to the rise-up timing of the detected signal Sblm. This means, when explained with reference to FIG. 2, that the timing to activate the sense amplifier circuit is controlled in consideration of also the curve B. Accordingly, it is possible to provide a semiconductor memory device that suppresses the possibility of erroneous reading while at the same time avoiding slowdown of the operation speed. This effect of the signal detection circuit 30 will be explained with reference to FIG. 3A and FIG. 3B.

Figure 3A:
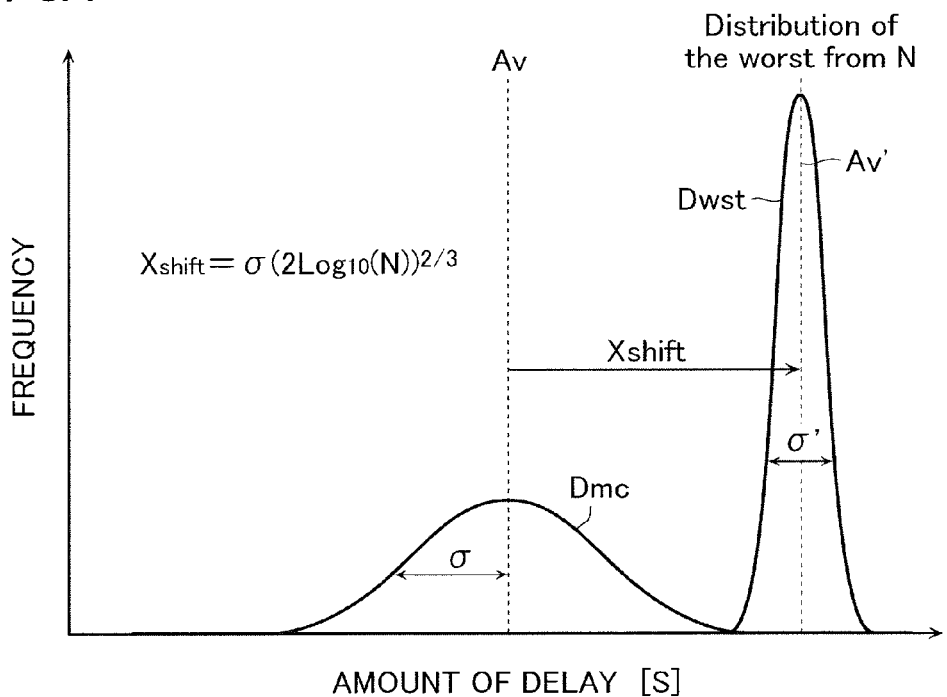
FIG. 3A is a graph explaining an effect of a signal detection circuit 30 shown in FIG. 1.

In FIG. 3A, a distribution curve Dmc having a standard deviation σ represents dispersion (distribution) of the amounts of delay of the output signals from the memory cells MC. A distribution curve Dwst having standard deviation σ'(<σ) on the right hand side of the graph represents distribution of the amount of delay of an output signal having the largest amount of delay among output signals output by N memory cells MC, where the N memory cells MC are randomly selected from the numerous memory cells MC.

The standard deviation σ' of the distribution curve Dwst is by far smaller than σ. The average Av' of the distribution curve Dwst is larger than the average Av of the distribution curve Dmc by a value Xshift, which is expressed by the following equation.

$$X\text{shift} = \sigma(2\log_{10}(N))^{2/3} \quad \text{[Equation 1]}$$

That is, the relationship between the averages Av' and Av can be expressed by the following equation. The average Av' can be regarded substantially as the largest (worst) value among the amounts of delay of the output signals output by the memory cells MC.

$$Av' = Av + \sigma(2\log_{10}(N))^{2/3} \quad \text{[Equation 2]}$$

If it is possible to somehow know the worst value among the amounts of delay of the output signals of the memory cells MC, it becomes possible to activate the sense amplifier circuit at an appropriate timing, thereby preventing slowdown of the operation speed and erroneous reading of data, even when there occurs a large dispersion in the amount of delay due to a lowered voltage.

In order to estimate the worst value among the amounts of delay of the output signals of the memory cells MC, the present embodiment detects, from among output signals Sbl output by the plurality of replica circuits 21 each composed of replica cells RC, an output signal Sblm that rises up at the latest timing. The replica cells RC retain certain data fixedly. Normally, the replica cells RC have the same cell structure as that of the memory cells MC, and hence the same characteristic as that of the memory cells MC. It is possible to make the replica cells RC retain certain data fixedly by forming the replica cells RC in the same cell structure as that of the memory cells MC, while on the other hand, forming a wiring layer above the replica cells in a layout, etc. different from those of the wiring layer above the memory cells MC.

Figure 3B:
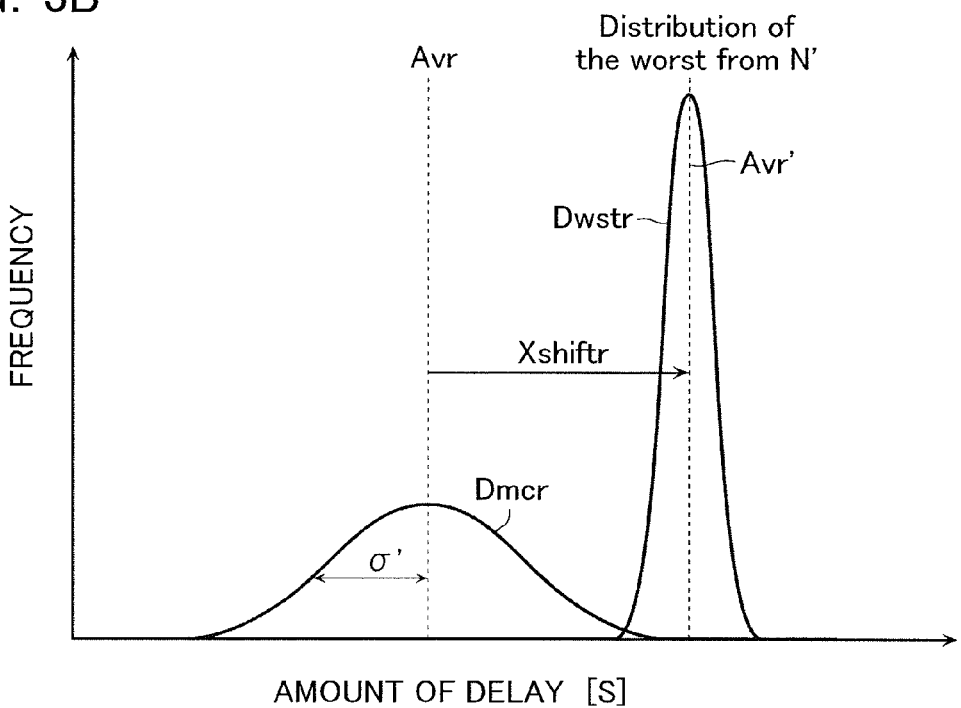
FIG. 3B is a graph explaining an effect of the signal detection circuit 30 shown in FIG. 1.

Let it be assumed that the number of the replica circuits 21 in the replica cell array 20 is N' and the number of the replica cells RC included in one replica circuit 21 is n. Let it be further assumed that the number of the replica cells RC in one replica circuit 21 that flow a certain current is m. Since the replica cell RC has the same configuration as that of the memory cell MC, a distribution curve Dmcr of the amounts of delay of the output signals from the replica circuits 21 is similar to that of the memory cells MC, as shown in FIG. 3B. However, the average Avr of this distribution curve is Avr=Av/N'm and the standard deviation σ' thereof is σ'=σ/(N'm√m). N' replica circuits 21 are randomly selected from the numerous replica circuits 21 having the characteristic represented by the distribution curve Dmcr, and the distribution of the amount of delay of an output signal having the largest amount of delay among the output signals output by the N' replica circuits 21 is calculated.

In this case, the average Avr' of the distribution curve Dwstr representing the distribution of this largest amount of delay can be expressed by the following equation, in relation to the average Avr=Av/N'm.

$$Avr'=Av/N'm+\alpha/(N'm\sqrt{m})\cdot(2\log_{10}(N'))^{2/3}$$ [Equation 3]

Here, when the supply voltage Vdd is low, the first term of the right-hand side of [Equation 2] and [Equation 3] above can be ignored because it is by far smaller than the second term of the right-hand side thereof. Accordingly, a ratio A=Av'/Avr' between the Av' and Avr' can be expressed by the following equation, based on division between both the equations.

$$A=N'm^{3/2}(\log_N N)^{2/3}$$ [Equation 4]

Hence, by the delay circuit 40 delaying the signal b' by the ratio A and thus obtaining the signal a' (i.e., multiplying the amount of delay of the signal b' by the ratio A), it is possible to match the amount of delay of the signal b' with the worst value among the amounts of delay of the output signals output by the memory cells MC. The control circuit 50 controls the sense amplifier circuit S/A in accordance with this signal a'. As is clear from [Equation 4] above, it is possible to say that the rate A is determined by the ratio between the number N of memory cells MC included in the memory cell array 10 and the number N' of replica circuits 21 included in the replica cell array 20, and that the delay circuit 40 determines the amount of delay in accordance with this ratio. According to this, even when the supply voltage Vdd is low, it is possible to suppress erroneous reading without dropping the operation speed.

Figure 4:
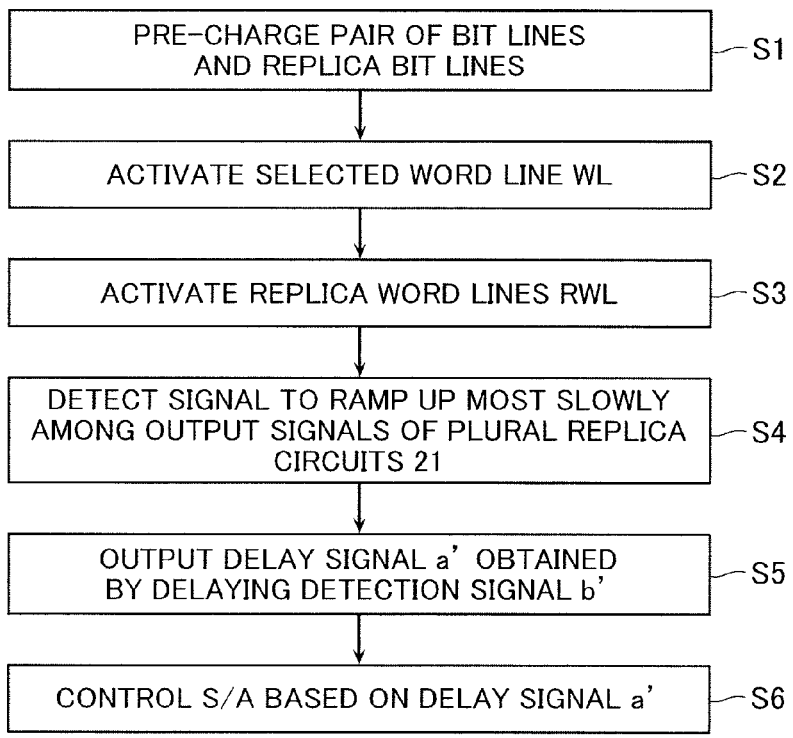
FIG. 4 is a flowchart showing a method of controlling the semiconductor memory device according to an embodiment of the present invention.

Next, the operation procedure of the semiconductor memory device of the present embodiment for reading data will be explained with reference to the flowchart of FIG. 4.

First, a pair of bit lines BL,/BL, and replica bit lines RBL are pre-charged to a predetermined pre-charge potential (step S1). Then, a selected word line WL connected to a selected memory cell MC is activated (step S2), and at the same time as or subsequently to this, replica word lines RWL are activated (step S3). As a result, the memory cell MC becomes electrically conductive and starts to output its retained data to the pair of bit lines BL,/BL. Together with this, the replica circuits 21 become electrically conductive and start to output the retained data to the replica bit lines RBL.

Since the replica bit lines RBL rises up to a predetermined potential at different speeds respectively, the signal detection circuit 30 detects the signal that rises up at the latest timing among the signals of the plurality of replica bit lines RBL, and outputs a detection signal b' corresponding to that signal (step S4). The delay circuit 40 delays the detection signal b' by the aforementioned ratio A (multiplies the amount of delay of the detection signal b' by the ratio A) to generate a delay signal a' (step S5). The control circuit 50 controls the sense amplifier circuit S/A in accordance with the delay signal a' (step S5).

Figure 5:
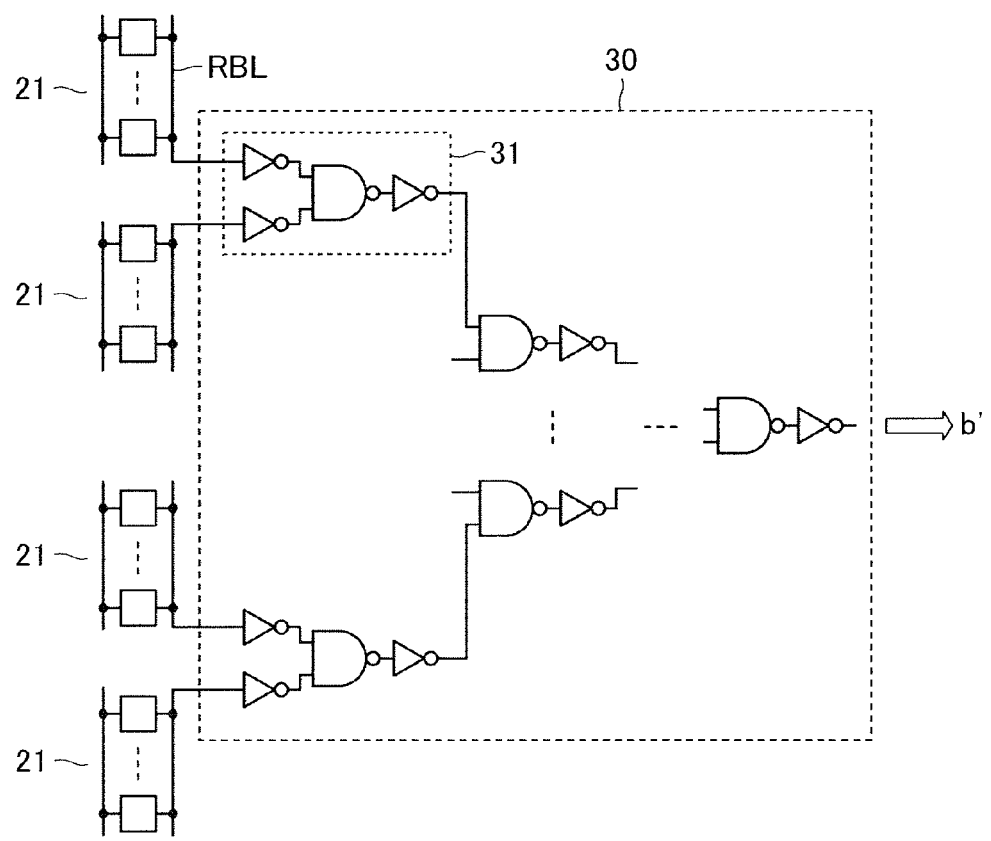
FIG. 5 is a circuit diagram showing one specific example of the configuration of the signal detection circuit 30.

Next, one specific example of the configuration of the signal detection circuit 30 will be explained with reference to FIG. 5. The signal detection circuit 30 includes logical operation circuits 31. Each logical operation circuit 31 has two input terminals, each of which is connected to one replica bit line RBL provided per replica circuit 21. The logical operation circuit 31 outputs a signal that is synchronous with an output signal having the larger amount of delay out of the output signals from these two replica circuits 21. Similar logical operation circuits 31 are connected to the output terminal of each of these logical operation circuits 31 in a hierarchical structure, which makes the signal detection circuit 30 outputs an output signal that corresponds to the output signal having the largest amount of delay among the output signals of the plurality of replica circuits 21, as its output signal b'. The circuit of FIG. 5 is one example, and circuits of any other mechanisms may be employed as long as such circuits can specify an output signal having the largest amount of delay.

Though the embodiment of the invention having been explained, the present invention is not limited to this but various alterations, additions, etc. can be made within the scope of the spirit of the invention.

What is claimed is:

1. A semiconductor memory device comprising:
   a memory cell array comprising a plurality of memory cells, each memory cell being at an intersection of a word line and a bit line;
   a sense amplifier circuit configured to sense and amplify a signal on the bit line;
   a plurality of replicators configured to retain data fixedly and to generate one or more output signals;
   a signal detector configured to detect the latest of the one or more output signals generated by the plurality of replicators, and to output a detection signal; and
   a delay circuit configured to generate a delay signal by delaying the detection signal;
   wherein the sense amplifier circuit is configured to activate based on the delay signal.

2. The semiconductor memory device of claim 1, wherein the delay circuit is configured to delay the detection signal by an amount of time that is based on a ratio between the number of memory cells in the memory cell array and the number of replicators.

3. The semiconductor memory device of claim 2, wherein the signal detector comprises a logical operation circuit configured to output the detection signal in accordance with a result of a logical operation performed on the one or more output signals generated by the plurality of replicators.

4. The semiconductor memory device of claim 3, wherein each of the plurality of replicators comprises a plurality of replica cells.

5. The semiconductor memory device of claim 4, wherein the replica cells comprise the same configuration as that of the memory cells.

6. The semiconductor memory device of claim 1, wherein the signal detector comprises a logical operation circuit configured to output the detection signal in accordance with a result of a logical operation performed on the one or more output signals generated by the plurality of replicators.

7. The semiconductor memory device of claim 1, wherein each of the plurality of replicators comprise a plurality of replica cells.

8. A semiconductor memory device comprising:
   a memory cell array comprising a plurality of memory cells each memory cell being at an intersection of a word line and a bit line;
   a sense amplifier circuit configured to sense and amplify a signal on the bit line;
   a plurality of replicators configured to retain data fixedly and to generate one or more output signals;
   a signal detector configured to detect the latest of the one or more output signals generated by the plurality of replicators, and to output a detection signal;
   a delay circuit configured to delay the detection signal by an amount of time based on a ratio between the number of memory cells in the memory cell array and the number of replicators, and to output the delayed detection signal as a delay signal; and
   a control circuit configured to activate the sense amplifier circuit based on the delay signal.

9. The semiconductor memory device of claim 8, wherein the signal detector comprises a logical operation circuit configured to output the detection signal in accordance with a result of a logical operation performed on the one or more output signals generated by the plurality of replicators.

10. The semiconductor memory device of claim 8, wherein each of the plurality of replicators includes a plurality of replica cells.

11. The semiconductor memory device of claim 8, wherein the replica cell has the same configuration as that of the memory cells.

12. A method of controlling a semiconductor memory device, the method comprising:
   detecting a latest output signal out of one or more output signals generated by a plurality of replicators;
   generating a detection signal based upon the latest output signal;
   generating a delay signal by delaying the detection signal; and
   activating a sense amplifier circuit based on the delay signal.

13. The method of controlling a semiconductor memory device of claim 12, wherein generating the delay signal comprises delaying the detection signal by an amount of time based on a ratio between the number of the memory cells in the memory cell array and the number of the replicators.

14. The method of controlling a semiconductor memory device of claim 12, wherein generating a detection signal comprises performing a logical operation on the one or more output signals generated by the plurality of replicators.

15. The method of controlling a semiconductor memory device of claim 12, wherein each of the plurality of replicators comprises a plurality of replica cells.

16. The method of controlling a semiconductor memory device of claim 12, wherein each replica cell has the same configuration as that of a plurality of associated memory cells.

* * * * *